United States Patent
Jung et al.

(10) Patent No.: US 10,862,067 B2
(45) Date of Patent: Dec. 8, 2020

(54) ORGANIC LIGHT EMITTING DISPLAY DEVICE INCLUDING A PLURALITY OF FIRST AND SECOND BARRIERS ON A FIRST AND SECOND SUBSTRATE

(71) Applicant: LG DISPLAY CO., LTD., Seoul (KR)

(72) Inventors: Goeun Jung, Goyang-si (KR); Hyung Geun Kwon, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/370,586

(22) Filed: Dec. 6, 2016

(65) Prior Publication Data

US 2017/0179422 A1 Jun. 22, 2017

(30) Foreign Application Priority Data

Dec. 18, 2015 (KR) .................. 10-2015-0181811

(51) Int. Cl.
*H01L 51/52* (2006.01)
*H01L 27/32* (2006.01)

(52) U.S. Cl.
CPC .......... *H01L 51/525* (2013.01); *H01L 27/323* (2013.01); *H01L 27/3276* (2013.01); *H01L 51/5243* (2013.01); *H01L 51/5246* (2013.01); *H01L 27/3244* (2013.01)

(58) Field of Classification Search
CPC . H01L 51/525; H01L 27/323; H01L 27/3276; H01L 51/5243; H01L 51/5246
USPC ............................................. 257/40, 59, 49
See application file for complete search history.

(56) References Cited

U.S. PATENT DOCUMENTS

| | | | |
|---|---|---|---|
| 9,450,202 B2 * | 9/2016 | Chen | H01L 51/5246 |
| 2008/0001864 A1 * | 1/2008 | Lee | H01L 27/3253 345/82 |
| 2010/0013745 A1 * | 1/2010 | Kim | G06F 3/0412 345/76 |
| 2010/0258346 A1 * | 10/2010 | Chen | H01L 21/56 174/521 |
| 2011/0316802 A1 | 12/2011 | Choi | |
| 2012/0138935 A1 * | 6/2012 | Park | H01L 27/3279 257/59 |
| 2012/0153814 A1 | 6/2012 | Lee et al. | |
| 2012/0299888 A1 * | 11/2012 | Kim | G02F 1/13452 345/205 |
| 2013/0026476 A1 * | 1/2013 | Park | H01L 27/3276 257/59 |

(Continued)

FOREIGN PATENT DOCUMENTS

| | | |
|---|---|---|
| CN | 103594483 A | 2/2014 |
| CN | 103855105 A | 6/2014 |

(Continued)

*Primary Examiner* — Lex H Malsawma
*Assistant Examiner* — Eric W Jones
(74) *Attorney, Agent, or Firm* — Seed IP Law Group LLP (57) ABSTRACT

An organic light emitting display device is provided that includes a first substrate having a first pad electrode; a second substrate having a touch array and a second pad electrode connected to the touch array; a plurality of first barriers provided on one surface of the first substrate adjacent to the first pad electrode; and a plurality of second barriers provided on the other surface of the second substrate facing one surface of the first substrate, wherein the first barriers are coupled to the second barriers alternately with each other.

15 Claims, 7 Drawing Sheets

(56) References Cited

U.S. PATENT DOCUMENTS

| | | | |
|---|---|---|---|
| 2014/0042398 A1 | 2/2014 | Choi et al. | |
| 2014/0061597 A1* | 3/2014 | Choi .................. | H01L 51/5284 257/40 |
| 2014/0078077 A1* | 3/2014 | Choi .................... | H01L 27/323 345/173 |
| 2014/0160710 A1* | 6/2014 | Yan .................... | H01L 51/5246 361/784 |
| 2014/0184937 A1* | 7/2014 | Lim .................... | H01L 27/323 349/12 |

FOREIGN PATENT DOCUMENTS

| | | |
|---|---|---|
| CN | 103904097 A | 7/2014 |
| KR | 100876107 B1 | 12/2008 |

* cited by examiner

ORGANIC LIGHT EMITTING DISPLAY DEVICE INCLUDING A PLURALITY OF FIRST AND SECOND BARRIERS ON A FIRST AND SECOND SUBSTRATE

CROSS REFERENCE TO RELATED APPLICATIONS

This application claims the benefit of Korean Patent Application No. 10-2015-0181811 filed on Dec. 18, 2015, which is hereby incorporated by reference for all purposes as if fully set forth herein.

BACKGROUND

Field of the Disclosure

The present disclosure relates to an organic light emitting display device.

Discussion of the Related Art

An organic light emitting display (OLED) device is a self light emitting display device, and has low power consumption, a fast response speed, high light emission efficiency, high luminance and a broad viewing angle.

The organic light emitting display (OLED) device may be categorized into one of a top emission type and a bottom emission type, depending on a direction to which light emitted through an organic light emitting diode is transmitted. The bottom emission type organic light emitting display device has a problem in that an aperture ratio is deteriorated as a circuit device is arranged between a light emitting layer and an image display surface, whereas the top emission type organic light emitting display device has an advantage in that an aperture ratio is improved as a circuit device is not arranged between a light emitting layer and an image display surface.

Figure 1:
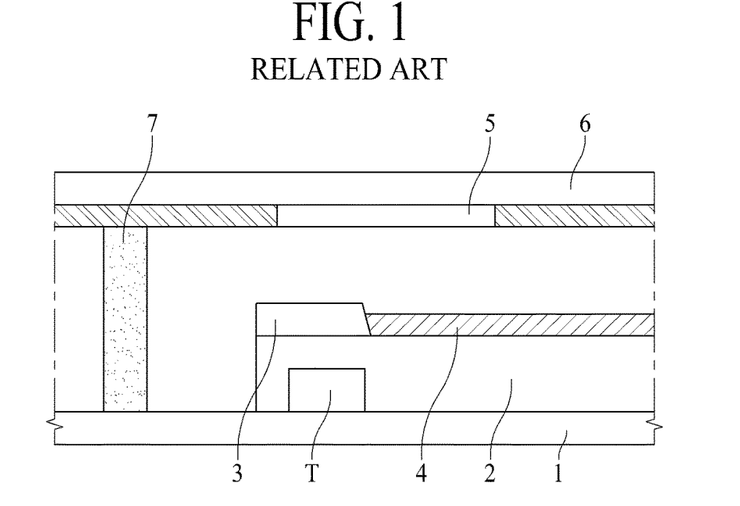
FIG. 1 is a cross-sectional view illustrating an organic light emitting display device of the related art.

FIG. 1 is a brief cross-sectional view illustrating an organic light emitting display device of the related art.

As shown in FIG. 1, in the organic light emitting display device of the related art, a thin film transistor layer T, which includes an active layer, a gate insulating film, a gate electrode, an inter layer dielectric, a source electrode and a drain electrode, is arranged on a first substrate 1, and a planarization layer 2 is arranged on the thin film transistor layer T.

A bank 3 is arranged on the planarization layer 2, and a light emitting layer 4 is arranged next to one or both sides of the bank 3.

A color filter 5 is arranged on a second substrate 6, and a conductive member 7, which connects the first substrate 1 with the second substrate 6, is arranged at an edge portion of the second substrate 6.

In the aforementioned organic light emitting display device of the related art, heat and pressure are applied during the process of attaching the conductive member 7 (which may be, for example, a conductive film) between the first substrate 1 and the second substrate 6. In this process, the first substrate 1 and the second substrate 6 may be distorted. If the first substrate 1 and the second substrate 6 are distorted, an opening area of the color filter 5 arranged on the second substrate 6 is not matched with an opening area of the light emitting layer 4 arranged on the first substrate 1, whereby a problem occurs in that image quality and reliability of the organic light emitting display device are deteriorated.

SUMMARY

Accordingly, the present disclosure is directed to an organic light emitting display device that substantially reduces one or more problems due to limitations and disadvantages of the related art.

In one or more embodiments, the present disclosure provides an organic light emitting display device that prevents image quality and reliability from being deteriorated.

Additional advantages and features of the disclosure will be set forth in part in the description which follows and in part will become apparent to those having ordinary skill in the art upon examination of the following or may be learned from practice of the embodiments provided by this disclosure. The objectives and other advantages of the embodiments provided by this disclosure may be realized and attained by the structure particularly pointed out in the written description and claims hereof as well as the appended drawings.

To achieve these objects and other advantages and in accordance with the purpose of the disclosure, as broadly described herein, in one or more embodiments an organic light emitting display device is provided that includes a first substrate having a first pad electrode; a second substrate having a touch array and a second pad electrode connected to the touch array; a plurality of first barriers provided on one surface of the first substrate adjacent to the first pad electrode; and a plurality of second barriers provided on the other surface of the second substrate facing one surface of the first substrate, wherein the first barriers are coupled to the second barriers alternately with each other.

It is to be understood that both the foregoing general description and the following detailed description of embodiments of the present disclosure are exemplary and explanatory and are intended to provide further explanation of the invention as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the terms such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on" or "above" a second element, it should be understood that the first and second elements may be brought into contact with each other, or a third element may be interposed between the first and second elements.

Hereinafter, the preferred embodiments of an organic light emitting display device according to the present disclosure will be described with reference to the accompanying drawings. Wherever possible, the same reference numbers will be used throughout the drawings to refer to the same or like parts. Also, in the following description of embodiments of the present disclosure, if detailed description of elements or functions known in respect of the present disclosure is determined to make the subject matter of the present disclosure unnecessarily obscure, then such detailed description will be omitted.

Figure 2:
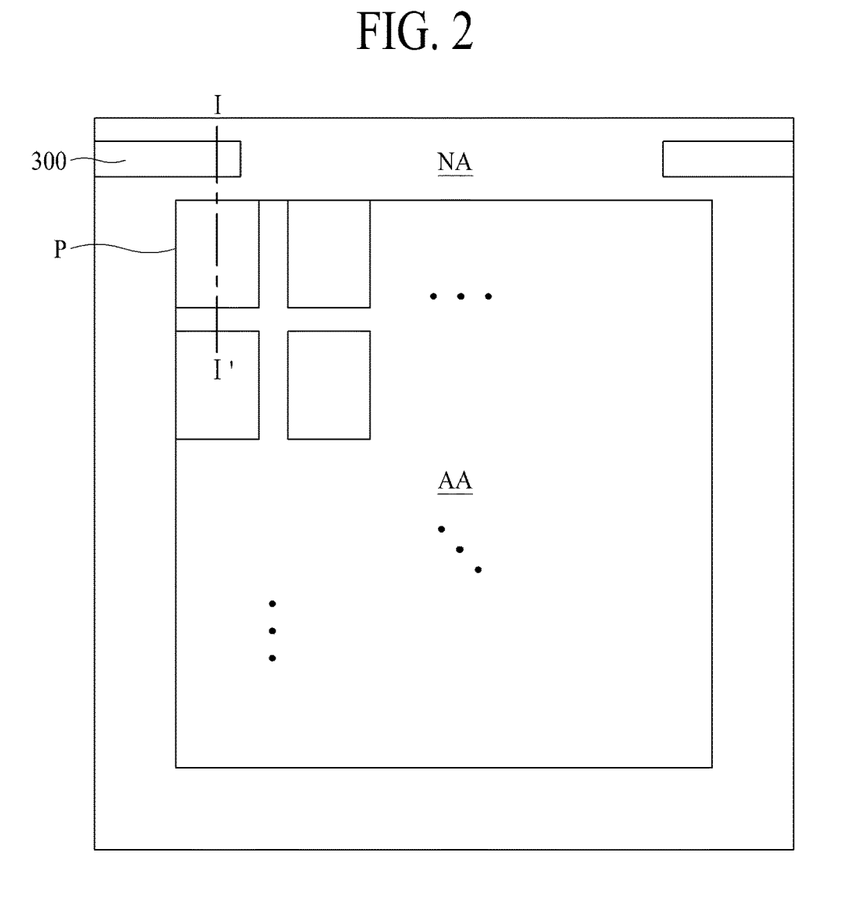
FIG. 2 is a plan view illustrating an organic light emitting display device according to a first embodiment of the present disclosure.
Figure 3:
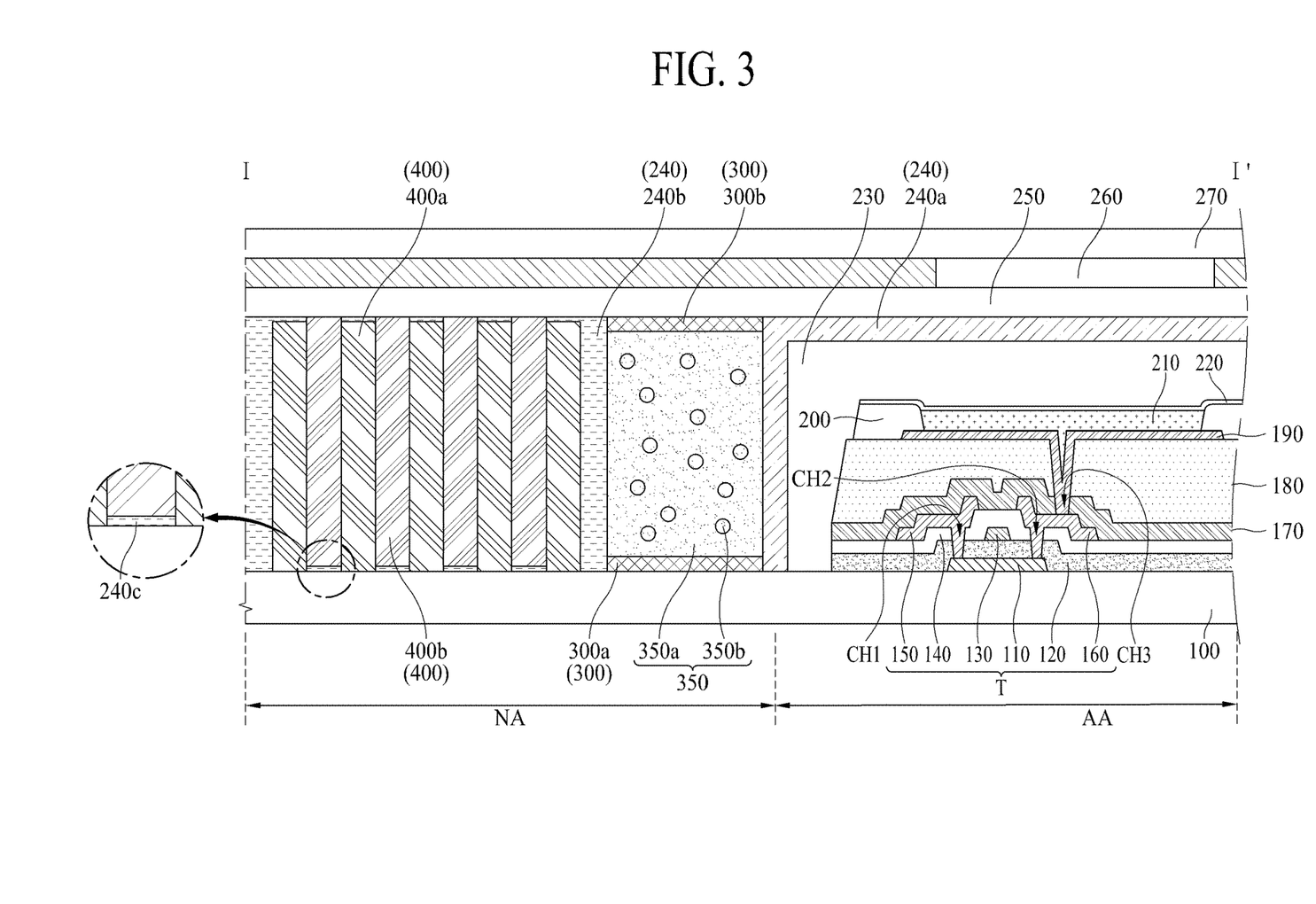
FIG. 3 is a cross-sectional view illustrating the organic light emitting display device according to the first embodiment of the present disclosure, taken along line I-I' of FIG. 2.

FIG. 2 is a plan view illustrating an organic light emitting display device according to one embodiment of the present disclosure, and FIG. 3 is a cross-sectional view illustrating the organic light emitting display device according to the first embodiment of the present disclosure, taken along line I-I' of FIG. 2.

Referring to FIGS. 2 and 3, the organic light emitting display device according to the first embodiment of the present disclosure includes a display area AA and a non-display area NA.

The display area AA includes a plurality of pixels P arranged in a horizontal direction and a vertical direction. This display area AA of the organic light emitting display device according to the first embodiment of the present disclosure includes a first substrate 100, a thin film transistor T, a passivation layer 170, a planarization layer 180, a first electrode 190, a bank 200, an organic light emitting layer 210, a second electrode 220, an encapsulation layer 230, a resin layer 240, a touch array 250, a color filter 260, and a second substrate 270.

The first substrate 100 is exemplary, and may serve as a lower substrate. The thin film transistor T is arranged above the first substrate 100.

The thin film transistor T includes an active layer 110, a gate insulating film 120, a gate electrode 130, an inter layer dielectric 140, a source electrode 150 and a drain electrode 160.

The active layer 110 is arranged on the first substrate 100 and is overlapped by the gate electrode 130. The active layer 110 may be made of a silicon based semiconductor material or an oxide based semiconductor material. Although not shown, a light-shielding film may additionally be formed between the first substrate 100 and the active layer 110.

The gate insulating film 120 is formed on the active layer 110. The gate insulating film 120 serves to insulate the active layer 110 from the gate electrode 130. The gate insulating film 120 may be made of, but not limited to, an inorganic insulating material, for example, a silicon oxide film ($SiO_X$), a silicon nitride film ($SiN_X$), or a multi-layer of $SiO_X$ and $SiN_X$.

The gate electrode 130 is formed on the gate insulating film 120. The gate electrode 130 is formed overlying the active layer 110, with the gate insulating film 120 being interposed therebetween. The gate electrode 130 may be made of, but not limited to, a single layer or multi-layer, which is comprised of any one of Mo, Al, Cr, Au, Ti, Ni, Nd and Cu or their alloys.

The inter layer dielectric 140 is formed on the gate electrode 130. The inter layer dielectric 140 may be formed of, but not limited to, the same inorganic insulating material as that of the gate insulating film 120, for example, a silicon oxide film ($SiO_X$), a silicon nitride film ($SiN_X$), or a multi-layer of $SiO_X$ and $SiN_X$.

The source electrode 150 and the drain electrode 160 are formed on the inter layer dielectric 140 to face each other. The aforementioned gate insulating film 120 and the aforementioned inter layer dielectric 140 are provided with a first contact hole CH1 and a second contact hole CH2, wherein the first contact hole CH1 exposes a first end area of the active layer 110, and the second contact hole CH2 exposes a second end area of the active layer 110. The source electrode 150 is connected with the first end area of the active layer 110 through the first contact hole CH1, and the drain electrode 160 is connected with the second end area of the active layer 110 through the second contact hole CH2.

The structure of the aforementioned thin film transistor layer T is not limited to the shown structure, and various modifications may be made in the structure of the thin film transistor layer T by the structure known to the person skilled in the art. For example, although a top gate structure is shown in which the gate electrode 130 is formed above the active layer 110, the thin film transistor layer T may be formed of a bottom gate structure in which the gate electrode 130 is formed below the active layer 110.

The passivation layer 170 is formed on the thin film transistor layer T. The passivation layer 170 serves to protect the thin film transistor layer T. The passivation layer 170 may be made of, but not limited to, an inorganic insulating material, for example, a silicon oxide (SiOX) film or a silicon nitride (SiNX) film.

The planarization layer 180 is formed on the passivation layer 170. The planarization layer 180 serves to planarize an upper portion of the first substrate 100 provided with the thin film transistor T. The planarization layer 180 may be made of, but not limited to, an organic insulating material such as acryl resin, epoxy resin, phenolic resin, polyamides resin and polyimide resin.

The first electrode 190 is formed on the planarization layer 180. The aforementioned passivation layer 170 and the aforementioned planarization layer 180 are provided with a third contact hole CH3 that exposes the drain electrode 160, and the first electrode 190 is connected with the drain electrode 160 through the third contact hole CH3. That is, the first electrode 190 is electrically connected with the thin film transistor T. The first electrode 190 is arranged per pixel P, and may serve as an anode electrode, for example. The first electrode 190 may be made of indium-tin-oxide (ITO) or indium-zinc-oxide (IZO). Also, the first electrode 190 may be comprised of at least two or more layers that include metal materials having high reflective efficiency, for example, Mo, an alloy MoTi of Mo and Ti, Al, Ag, APC (Ag;Pb;Cu), etc.

The bank 200 is arranged on and/or adjacent to the first electrode 190. The bank 200 is arranged to partially overlap the first electrode 190, whereby a pixel P area is defined. That is, the bank 200 is arranged to cover a side of the first electrode 190 while exposing the upper surface of the first electrode 190. As the bank 200 is arranged to expose the upper surface of the first electrode 190, an area where an image is displayed may be obtained. The bank 200 may be made of, but not limited to, an organic insulating material such as polyimide resin, acryl resin, and BCB.

The organic light emitting layer 210 is arranged on the first electrode 190. The organic light emitting layer 210 may include a hole injecting layer, a hole transporting layer, an emitting layer, an electron transporting layer, and an electron injecting layer. The organic light emitting layer 210 may be modified to various types known to those skilled in the art.

The second electrode 220 is arranged on the organic light emitting layer 210. The second electrode 220 may serve as a cathode electrode if the first electrode 190 serves as an anode electrode. Since the second electrode 220 is formed on an area where light is emitted, the second electrode 220 is made of a transparent conductive material.

The encapsulation layer 230 is arranged on the entire second electrode 220. The encapsulation layer 230 may prevent water from being permeated into the organic light emitting display device. At this time, various materials known in the art may be used as the encapsulation layer 230.

The resin layer 240 includes a first resin layer 240a arranged in the display area AA, and a conductive member 350, a second resin layer 240b and a third resin layer 240c are arranged in the non-display area NA based on the conductive member 350. The second resin layer 240b and the third resin layer 240c will be described later.

The first resin layer 240a is arranged on the entire encapsulation layer 230. The first resin layer 240a is arranged between the first substrate 100 and the second substrate 270 to prevent light loss from occurring, and increases adhesion between the first substrate 100 and the second substrate 270. At this time, an air gap may occur between the first substrate 100 and the second substrate 270. In this case, if light is reflected from the organic light emitting layer 210 to the air gap, light is diffused inside the first resin layer 240a and fails to be reflected to the second substrate 270, whereby a problem may occur in that luminance or contrast is deteriorated. Therefore, in the organic light emitting display device according to one or more embodiments of the present invention, a resin material having a high refractive index is filled between the first substrate 100 and the second substrate 270, whereby light emitted from the organic light emitting layer 210 may reach the second substrate 270. For this reason, luminance or contrast may be prevented from being deteriorated.

The touch array 250 is formed to be patterned on the color filter 260. The touch array 250 includes transparent channel electrodes (not shown) formed to cross each other, and a touch pad (not shown) transferring a signal to each of the transparent channel electrodes, wherein the touch pad may be connected with a pad electrode 300.

The color filter 260 is arranged on the second substrate 270 to correspond to each pixel P area. The color filter 260 may include red, green and blue color filters corresponding to each pixel P area, and a light-shielding layer for preventing a mixture of colors may be included among the red, green and blue color filters.

The second substrate 270 may serve as an upper substrate if the first substrate 100 serves as a lower substrate.

The non-display area NA is provided outside the display area AA. The non-display area NA is provided with various pad electrodes and drivers for applying signals to the display area AA, and various modifications known in the art may be made in the non-display area NA.

The non-display area NA of the organic light emitting display device according to the first embodiment of the present invention includes a first substrate 100, a second resin layer 240b, a touch array 250, a color filter 260, a second substrate 270, a pad electrode 300, a conductive member 350, and barriers 400.

The first substrate 100, the touch array 250, the color filter 260 and the second substrate 270 extend from the display area AA to the non-display area NA, and their repeated description will be omitted.

The second resin layer 240b is fully arranged between the first and second substrates 100 and 270 of the non-display area NA, whereby adhesion between the first substrate 100 and the second substrate 270 is increased. That is, the second resin layer 240b may adhere the first substrate 100 to the second substrate 270 (or to another component attached to or otherwise supported by the second substrate 270, such as the touch array 250, the color filter 260 or the like).

The third resin layer 240c may be made of the material of the second resin layer 240b, and is interposed between the first substrate 100 and a second barrier 400b and between the second substrate 270 and a first barrier 400a during the process of attaching the first substrate 100 and the second substrate 270 to each other. The third resin layer 240c increases adhesion between the first substrate 100 and the second barrier 400b and between the second substrate 270 and the first barrier 400a.

The pad electrode 300 includes a first pad electrode 300a and a second pad electrode 300b. The first pad electrode 300a is arranged on the first substrate 100, and the second pad electrode 300b is arranged on the touch array 250 of the second substrate 270.

The conductive member 350 is arranged between the first substrate 100 and the second substrate 270. In more detail, one end of the conductive member 350 is connected with the first pad electrode 300a, and the other end of the conductive member 350 is connected with the second pad electrode 300b, whereby the first pad electrode 300a is electrically connected with the second pad electrode 300b. The conductive member 350 may be a conductive film having adhesiveness, and includes an adhesive material 350a and conductive particles 350b. The first pad electrode 300a may electrically be connected with the second pad electrode 300b through the conductive particles 350b.

The barriers 400 are arranged between the first substrate 100 and the second substrate 270, more specifically arranged outside the non-display area NA. The barriers 400 may be made of an organic material, and include first barriers 400a and second barriers 400b.

The first barriers 400a are formed arranged on the first substrate 100 and spaced apart from one another at a predetermined interval, and may be comprised of at least two barriers.

The second barriers 400b are arranged on the touch array 250 of the second substrate 270 and spaced apart from one another at a predetermined interval, and are alternately arranged with the first barriers 400a, and may be comprised of at least two or more barriers.

The first and second barriers 400a and 400b are fitted alternately with each other between the first and second substrates 100 and 270 on which the second resin layer 240b is arranged. At this time, as the first and second barriers 400a and 400b are fitted alternately with each other, the second resin layer 240b arranged between the first and second substrates 100 and 270 is pushed out. Therefore, a resin material constituting the second resin layer 240b is fitted between the first barrier 400a and the touch array 250 and between the second barrier 400b and the first substrate 100. The resin material includes an adhesive material, whereby adhesion between the first barrier 400a and the touch array 250 and adhesion between the second barrier 400b and the first substrate 100 are increased.

Also, since the first and second barriers 400a and 400b are alternately coupled with each other and therefore fix the first substrate 100 and the second substrate 270 so as not to be distorted, the first and second substrates 100 and 270 are not distorted by the first and second barriers 400a and 400b even through heat and pressure are applied to the first and second substrates 100 and 270 during the process of attaching the conductive member 350. Therefore, the organic light emitting display device according to the first embodiment of the present invention may prevent image quality and reliability from being deteriorated by distortion of the first substrate 100 and the second substrate 270.

Figure 4:
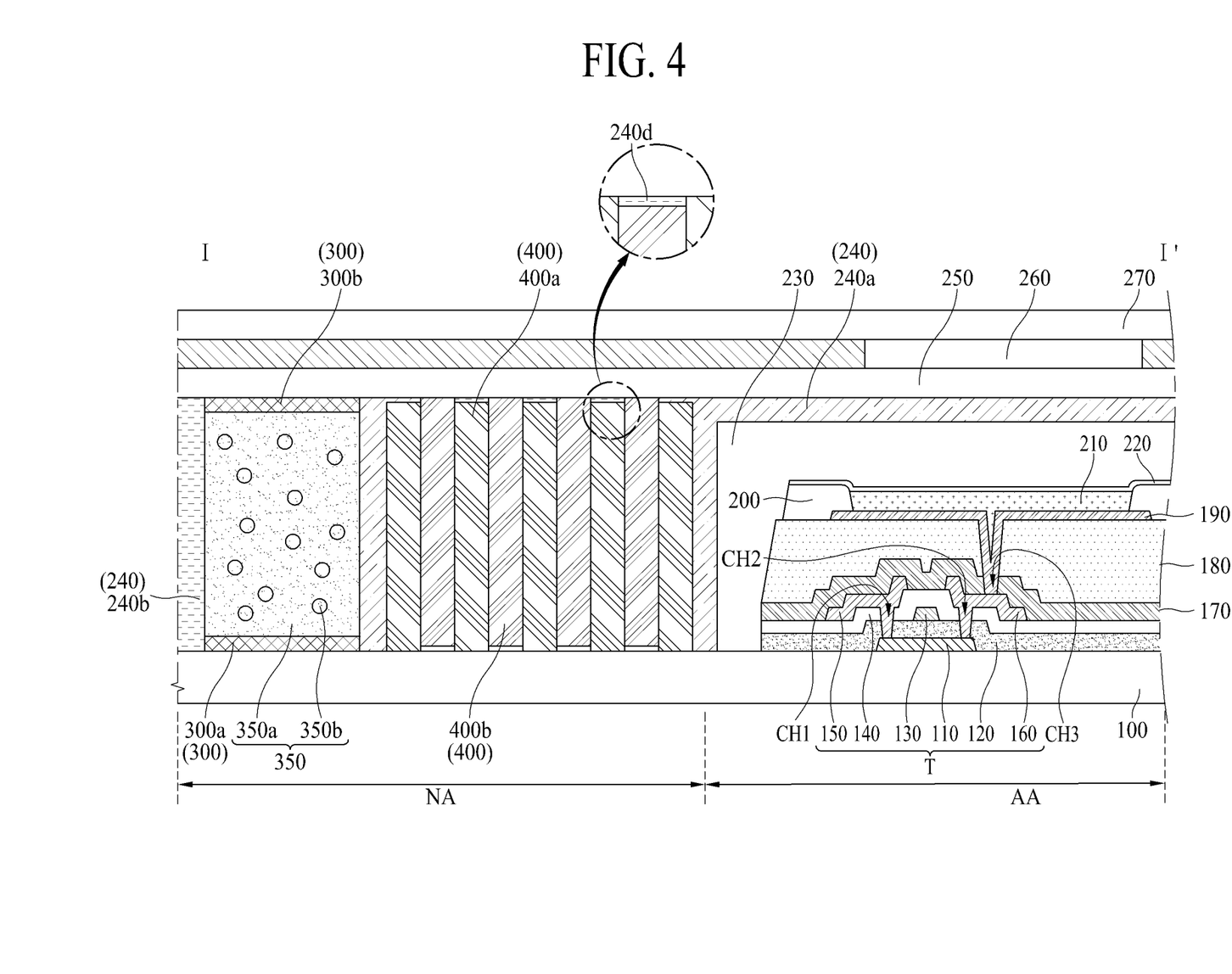
FIG. 4 is a cross-sectional view illustrating an organic light emitting display device according to a second embodiment of the present disclosure.

FIG. 4 is a cross-sectional view illustrating an organic light emitting display device according to the second embodiment of the present disclosure. The organic light emitting display device of FIG. 4 is the same as that according to the first embodiment shown in FIG. 3 except that a position of barriers is changed. Therefore, only the barriers will be described, and a repeated description of the same elements as those of FIG. 3 will be omitted.

The barriers 400 of the organic light emitting display device according to the second embodiment of the present invention are arranged between the conductive member 350, which is arranged outside the non-display area NA, and the display area AA. That is, the conductive member 350 of the organic light emitting display device according to the second embodiment of the present invention is arranged outside the non-display area NA farther than the barriers 400. The first resin layer 240a and the third resin layer 240d are arranged in or near the display area AA based on the conductive member 350, and the second resin layer 240b is arranged in an outer portion of the non-display area NA based on the conductive member 350. Therefore, the barriers 400 of the organic light emitting display device according to the second embodiment of the present invention may be arranged between the first and second substrates 100 and 270 on which the first resin layer 240a is arranged. The first resin layer 240a is formed by depositing a resin material on the encapsulation layer 230 and diffusing the resin material to reach the conductive member 350 while the first and second substrates 100 and 270 are being bonded to each other. However, in case of the organic light emitting display device of the related art, the resin material fails to be diffused between the conductive member 350 and the encapsulation layer 230, whereby a non-filling area may occur between the conductive member 350 and the encapsulation layer 230. If the non-filling area occurs between the conductive member 350 and the encapsulation layer 230, a crack may occur in the first and second substrates 100 and 270. Therefore, in the organic light emitting display device according to the second embodiment of the present invention, the barriers 400 may be arranged between the conductive member 350 and the encapsulation layer 230 to fill the non-filling area, whereby a crack may be prevented from occurring in the first and second substrates 100 and 270.

The barriers 400 are shown being arranged at only one side (e.g., the left side) of the conductive member 350 in the organic light emitting display device according to the first embodiment of the present invention, and the barriers 400 are similarly shown being arranged at only another side (e.g., the right side) of the conductive film 350 in the organic light emitting display device according to the second embodiment of the present invention. However, the barriers 400 and the conductive film 350 are not limited to the first and second embodiments of the present invention, and the conductive film 350 may be arranged between the barriers 400.

Since the barriers 400 fix the first substrate 100 and the second substrate 270 so as not to be distorted, the first and second substrates 100 and 270 are not distorted by the barriers 400 even though heat and pressure are applied to the first and second substrates 100 and 270 during the process of attaching the conductive film 350. Therefore, in the organic light emitting display device according to the second embodiment of the present invention, image quality and reliability of the organic light emitting display device may be prevented from being deteriorated by distortion of the first substrate 100 and the second substrate 270.

Figure 5A:
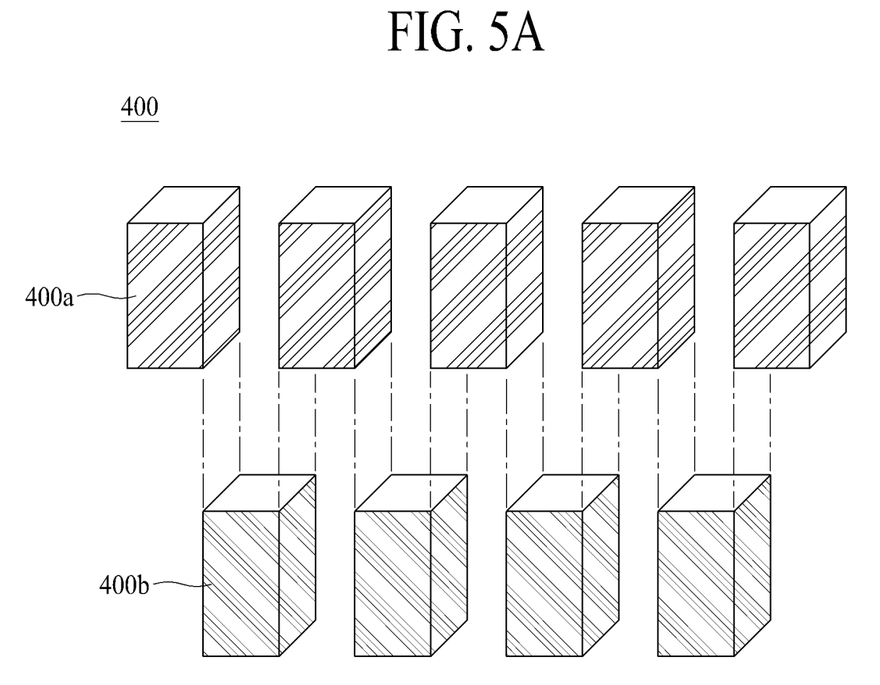
FIG. 5a is a perspective view illustrating barriers according to embodiments of the present disclosure.

FIG. 5a is a perspective view illustrating barriers according to one embodiment of the present disclosure.

Referring to FIG. 5a, the barriers 400 according to one embodiment of the present disclosure include first barriers 400a and second barriers 400b. The first and second barriers 400a and 400b are arranged alternately with each other. At this time, the first barriers 400a are arranged on the first substrate 100, and the second barriers 400b are arranged on the second substrate 270, whereby the first barriers 400a and the second barriers 400b are alternately fitted to each other. The barriers 400 according to one embodiment of the present disclosure are fixed in such a manner that the first and second barriers 400a and 400b alternately arranged are fitted to each other. That is, the first and second barriers 400a and 400b may be alternately arranged and in physical contact with one another. Therefore, the barriers 400 according to one embodiment of the present disclosure may fix the first and second substrates 100 and 270 so as not to be distorted, whereby image quality and reliability of the organic light emitting display device may be prevented from being deteriorated by distortion of the first substrate 100 and the second substrate 270.

Figure 5B:
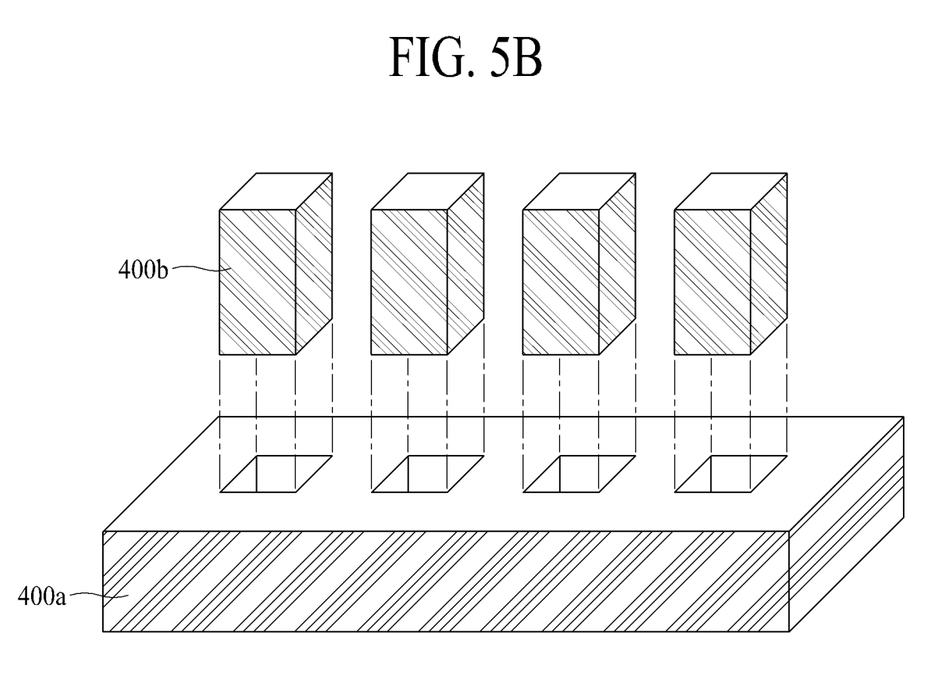
FIG. 5b is a perspective view illustrating barriers according to alternative embodiments of the present disclosure.

FIG. 5b is a perspective view illustrating barriers according to another embodiment of the present disclosure.

Referring to FIG. 5b, the barriers 400 according to another embodiment of the present disclosure include first barriers 400a and second barriers 400b, wherein the second barriers 400b are arranged to be fitted to the first barriers 400a. That is, the first barriers 400a are arranged on the first substrate 100 in the form of a plate having one or more grooves or slots of any shape for fitting the second barriers 400b thereinto, and the second barriers 400b are arranged on the second substrate 270 such that, when brought together toward the first substrate 100, the second barriers 400b fit snugly into the grooves or slots of the first barrier 400a. Meanwhile, although the second barriers 400b are shown in the form fitted to the first barriers 400a, the first barriers 400a may be fitted to the second barriers 400b without limitation to the shown form.

The barriers 400 according to another embodiment of the present invention are fixed in such a manner that the first and second substrates 400a and 400b are fitted to each other. Therefore, the barriers 400 according to another embodiment of the present invention may stably fix the first and second substrates 100 and 270 so as not to be distorted, and image quality and reliability of the organic light emitting display device may be prevented from being deteriorated by distortion of the first substrate 100 and the second substrate 270.

Figure 6:
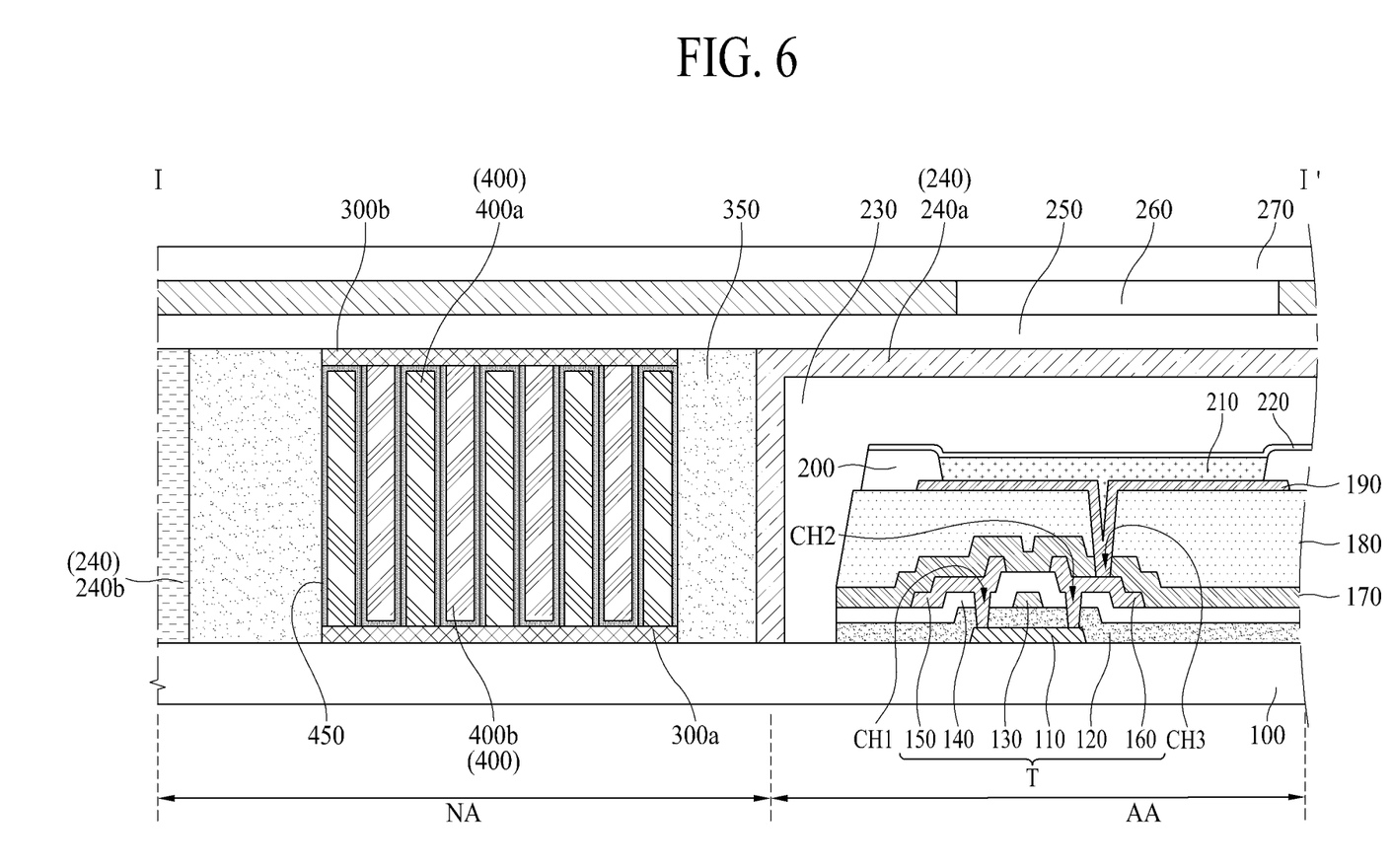
FIG. 6 is a cross-sectional view illustrating an organic light emitting display device according to a third embodiment of the present disclosure.

FIG. 6 is a cross-sectional view illustrating an organic light emitting display device according to the third embodiment of the present disclosure. The organic light emitting display device of FIG. 6 is the same as that according to the first embodiment shown in FIG. 3 except that a position of barriers is changed. Therefore, only the barriers will be described, and a repeated description of the same elements as those of FIG. 3 will be omitted.

The barriers 400 of the organic light emitting display device according to the third embodiment of the present disclosure are arranged between the pad electrode 300 and the conductive member 350. In more detail, the conductive member 350 is provided between a first pad electrode 300a and a second pad electrode 300b, and one end of the barriers 400 is arranged to adjoin the first pad electrode 300a and the other end of the barriers 400 is arranged to adjoin the second pad electrode 300b. Therefore, one end of the barriers 400 is electrically connected with the first pad electrode 300a, and the other end of the barriers 400 is electrically connected with the second pad electrode 300b, whereby the first and second pad electrodes 300a and 300b are electrically connected with each other. The conductive member 350 may be comprised of a liquid type adhesive material having flexibility, and may be diffused to the side of the barriers 400 as the barriers 400 are fixed. Therefore, the conductive member 350 and the barrier 400 of the organic light emitting display device according to the third embodiment of the present disclosure may prevent a non-filling area from being generated, whereby a crack may be prevented from being generated in the first and second substrates 100 and 270.

Also, an outer surface of the barriers 400 of the organic light emitting display device according to the third embodiment of the present disclosure is surrounded by a metal material 450. Therefore, the first pad electrode 300a and the second pad electrode 300b of the organic light emitting display device according to the third embodiment of the present disclosure may be electrically connected with each other by the metal material 450 surrounding the outer surface of the barrier 400 while the barriers 400 are being fixed.

Since the barriers 400 fix the first and second substrates 100 and 270 so as not to be distorted, the first and second substrates 100 and 270 are not distorted by the barriers 400 even though heat and pressure are applied to the first and second substrates 100 and 270 during the process of attaching the conductive member 350. Therefore, in the organic light emitting display device according to the third embodiment of the present invention, image quality and reliability of the organic light emitting display device may be prevented from being deteriorated by distortion of the first substrate 100 and the second substrate 270.

Figure 7:
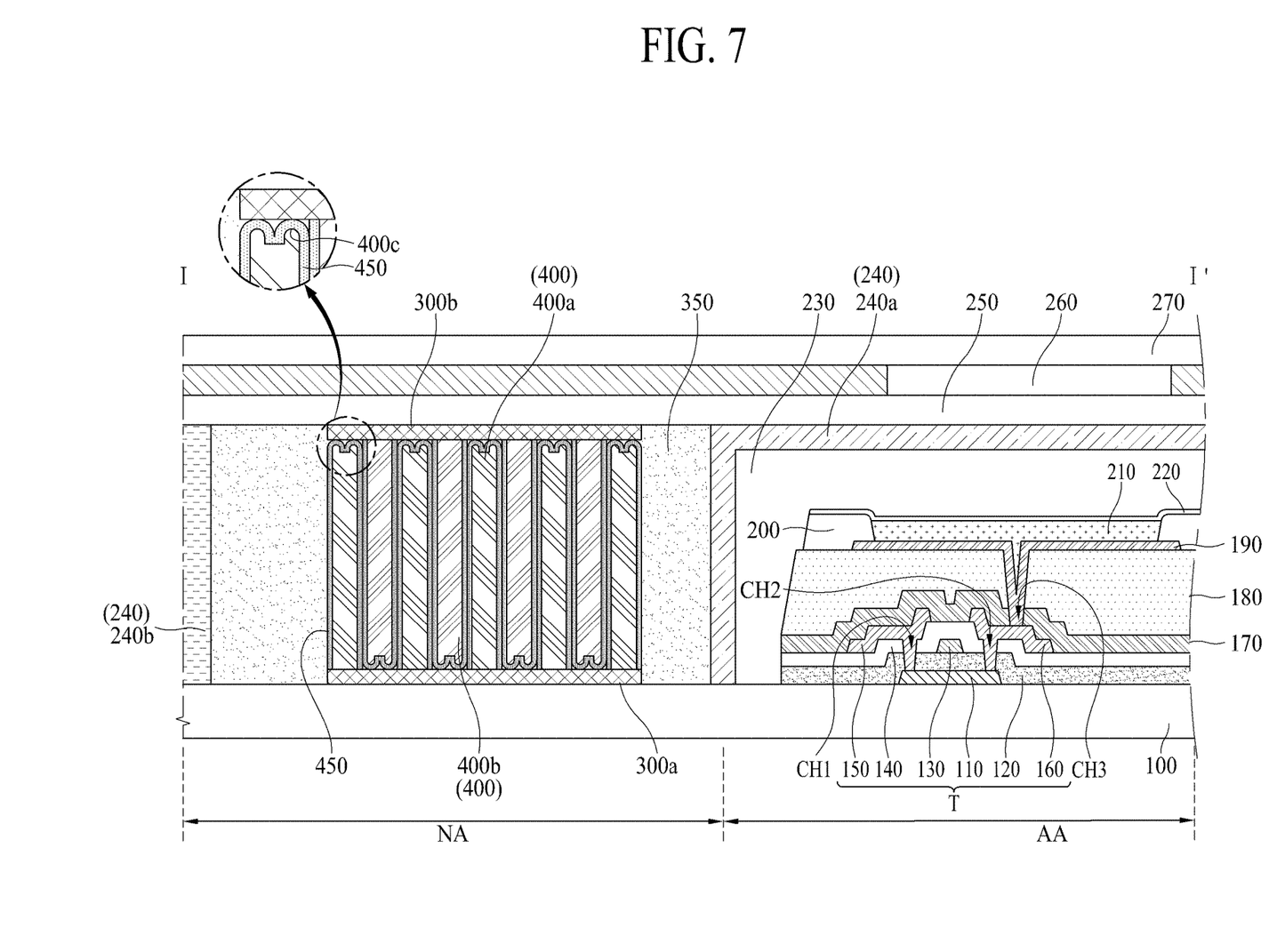
FIG. 7 is a cross-sectional view illustrating an organic light emitting display device according to a fourth embodiment of the present disclosure.

FIG. 7 is a cross-sectional view illustrating an organic light emitting display device according to the fourth embodiment of the present disclosure. The organic light emitting display device of FIG. 7 is the same as that according to the third embodiment shown in FIG. 6 except that a form of barriers is changed. Therefore, only the barriers will be described, and a repeated description of the same elements as those of FIG. 6 will be omitted.

An outer surface of the barrier 400 of the organic light emitting display device according to the fourth embodiment of the present disclosure is surrounded by a metal material 450, and each barrier 400 is provided with a protrusion 400c at an end. The protrusion 400c may have any protruding shape, and may be a single protrusion extending outwardly from the end of the barrier 400, or may be two or more of such protrusions. Therefore, the protrusion 400c of each barrier 400 of the organic light emitting display device according to the fourth embodiment of the present disclosure, which is surrounded by the metal material 450, is in contact with the pad electrode 300, and a first pad electrode 300a is electrically connected with a second pad electrode 300b. As the protrusion 400c is formed at the end of each barrier 400, the protrusion 400c formed at the end of each barrier 400 may be in contact with the pad electrode 300 even though the end of each barrier 400 is fixed to be spaced apart from the pad electrode 300 at a predetermined interval during the process of bonding the first substrate 100 to the second substrate 270. Therefore, the barriers 400 of the organic light emitting display device according to the fourth embodiment of the present disclosure may directly be in contact with the pad electrode 300 more efficiently than a case where a cross-section of the end of each barrier 400 is flat, and the first pad electrode 300a may electrically be connected with the second pad electrode 300b.

Also, the barriers 400 of the organic light emitting display device according to the fourth embodiment of the present disclosure may prevent a non-filling area from being generated, whereby a crack may be prevented from being generated in the first and second substrates 100 and 270. Also, since the barriers 400 fix the first and second substrates 100 and 270 so as not to be distorted, the first and second substrates 100 and 270 are not distorted by the barriers 400 even though heat and pressure are applied to the first and second substrates 100 and 270 during the process of attaching the conductive member 350. Therefore, in the organic light emitting display device according to the fourth embodiment of the present disclosure, image quality and reliability of the organic light emitting display device may be prevented from being deteriorated by distortion of the first substrate 100 and the second substrate 270.

Figure 8:
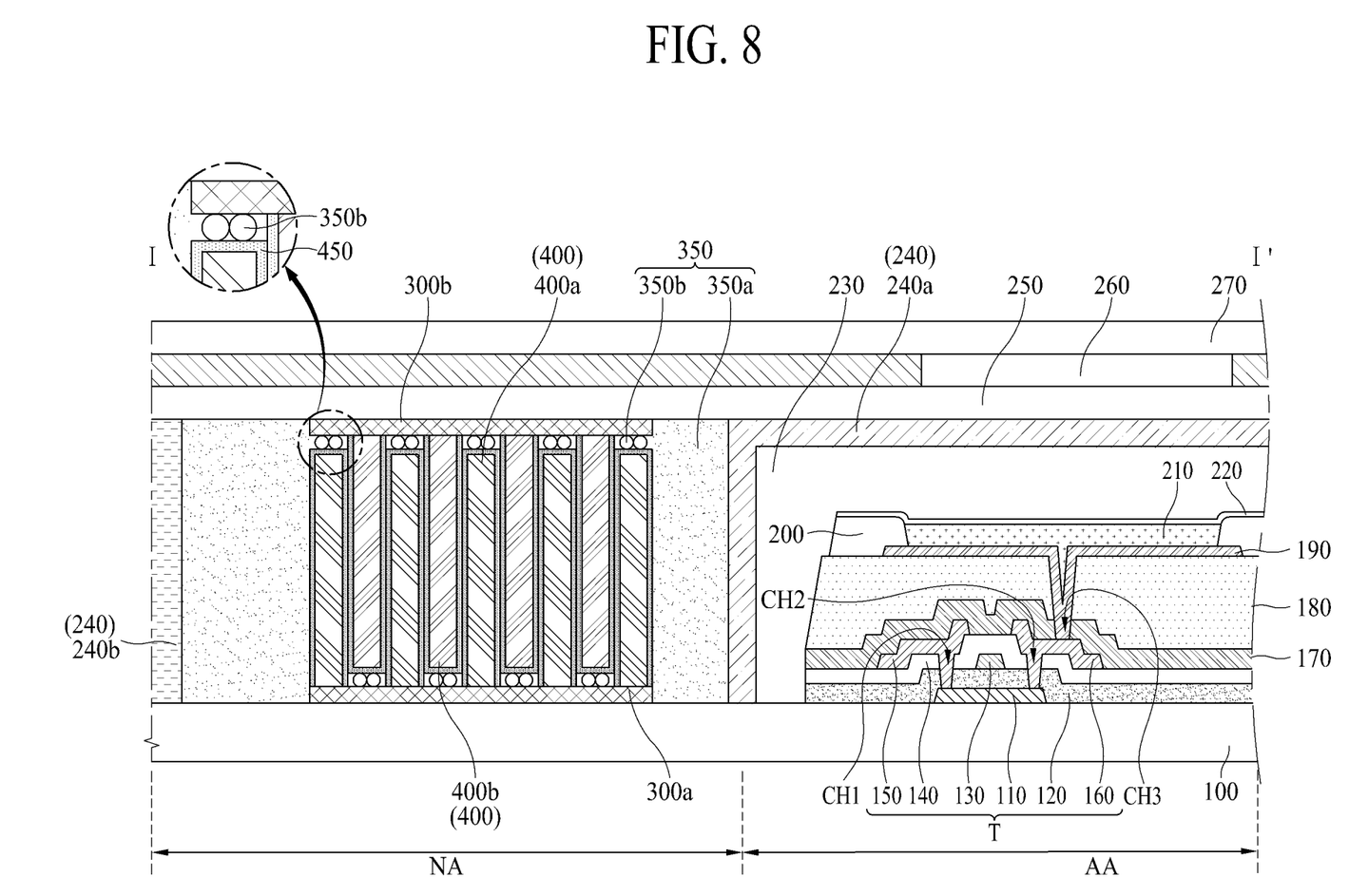
FIG. 8 is a cross-sectional view illustrating an organic light emitting display device according to a fifth embodiment of the present disclosure.

FIG. 8 is a cross-sectional view illustrating an organic light emitting display device according to the fifth embodiment of the present disclosure. The organic light emitting display device of FIG. 8 is the same as that according to the third embodiment shown in FIG. 6 except that conductive particles 350b are added to the barriers of the organic light emitting display device according to the third embodiment shown in FIG. 6. Therefore, only the barriers will be described, and a repeated description of the same elements as those of FIG. 6 will be omitted.

Referring to FIG. 8, an outer surface of the barriers 400 of the organic light emitting display device according to the fifth embodiment of the present disclosure is surrounded by a metal material 450, and first barriers 400a arranged on a first pad electrode 300a and second barriers 400b arranged on a second pad electrode 300b are arranged alternately with respect to each other. The first barriers 400a and the second barriers 400b are arranged on the non-display area NA of the first and second substrates 100 and 270 provided with the conductive member 350. At this time, the conductive member 350 includes a liquid type adhesive material and conductive particles 350b. The conductive particles 350b have flexibility by means of the liquid type adhesive material and therefore are arranged between the first and second barriers 400a and 400b. That is, if the first and second barriers 400a and 400b are fixed, the conductive particles 350b are fitted between the first barrier 400a and the second substrate 270 and between the second barrier 400b and the first substrate 100. At this time, one side of the conductive particles 350b is in contact with an end of the barriers 400 and the other side of the conductive particles 350b is in contact with the pad electrode 300, whereby the first pad electrode 300a is electrically connected with the second pad electrode 300b. Therefore, the barriers 400 of the organic light emitting display device according to the fifth embodiment of the present disclosure may directly be in contact with the pad electrode 300 efficiently by means of the conductive particles 350b, and the first pad electrode 300a may electrically be connected with the second pad electrode 300b.

Also, the barriers 400 of the organic light emitting display device according to the fifth embodiment of the present disclosure may prevent a non-filling area from being generated, whereby a crack may be prevented from being generated in the first and second substrates 100 and 270. Also, since the barriers 400 fix the first and second substrates 100 and 270 so as not to be distorted, the first and second substrates 100 and 270 are not distorted by the barriers 400 even though heat and pressure are applied to the first and second substrates 100 and 270 during the process of attaching the conductive film 350. Therefore, in the organic light emitting display device according to the fifth embodiment of the present disclosure, image quality and reliability of the organic light emitting display device may be prevented from being deteriorated by distortion of the first substrate 100 and the second substrate 270.

Meanwhile, the barriers 400 according to the present disclosure may also be arranged on a dead area of the pixel P arranged on the display area AA. The dead area is a non-opening area (i.e., an area outside of an opening area through which light is passed) of the pixel P, more specifically an area which is not overlapped with or overlying the organic light emitting layer 210. Therefore, even though the barriers 400 are arranged on the non-opening area, it may not affect an aperture ratio of the organic light emitting display device, and the problem of the related art may be solved.

As described above, according to the organic light emitting display device of the present disclosure, the following and various other advantages may be obtained.

The barriers are formed to fix the first and second substrates so as not to be distorted, whereby image quality and reliability of the organic light emitting display device may be prevented from being deteriorated.

Also, the barriers are formed to prevent a non-filling area from being generated, whereby a crack may be prevented from being generated in the first and second substrates.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
a first substrate having an encapsulation layer on a thin film transistor and a first pad electrode;
a second substrate having a touch array and a second pad electrode connected to the touch array;
a resin layer between the first and second substrates;
a plurality of first barriers provided on the first substrate adjacent to the first pad electrode, each of the first barriers spaced apart from the second substrate; and
a plurality of second barriers provided on the second substrate facing the first substrate, each of the second barriers spaced apart from the first substrate,
wherein the plurality of first barriers and the plurality of second barriers are comprised of organic materials, and are positioned between the first pad electrode and the second pad electrode,
wherein an outer surface of the first and second barriers is surrounded by a metal material, and
wherein one end of the first and second barriers is electrically connected with the first pad electrode, and the other end of the first and second barriers is electrically connected with the second pad electrode,
wherein the first and second barriers are alternately arranged, with each first barrier being adjacent to at least one second barrier, and each second barrier being adjacent to at least one first barrier, and
wherein the first and second barriers are positioned adjacent to the encapsulation layer to fill a non-filling area of the resin layer, thereby preventing a crack occurring in the first and second substrates.

2. The organic light emitting display device of claim 1, wherein the resin layer includes an adhesive material between the first substrate and the second barriers and between the second substrate and the first barriers.

3. The organic light emitting display device of claim 1, wherein a protrusion is provided at an end of the first and second barriers.

4. The organic light emitting display device of claim 1, further comprising a conductive member between the first and second substrates, the conductive member including a liquid type adhesive material and conductive particles.

5. The organic light emitting display device of claim 4, wherein the conductive particles are arranged between the first barrier and the second pad electrode and between the second barrier and the first pad electrode.

6. The organic light emitting display device of claim 4, wherein the conductive member is positioned between the first and second barriers and a display area of the device.

7. The organic light emitting display device of claim 4, wherein the first and second barriers are positioned between the conductive member and a display area of the device.

8. The organic light emitting display device of claim 1, wherein the first substrate has an opening area and a non-opening area, and the first and second barriers are arranged on the non-opening area.

9. An apparatus comprising:
a first substrate having a thin-film transistor (TFT) array thereon;
a second substrate having color filtering elements and an in-cell touch layer thereon, the first and second substrates being attached together to achieve a display panel;
a first pad electrode;
a second pad electrode facing the first pad electrode; and
a structure, located on corresponding portions of both the first and second substrates and between the first pad electrode and the second pad electrode, having a specific configuration that provides aligned interlocking or engagement of the first and second substrates, the structure including:
a first set of ribs on the first substrate; and
a second set of ribs on the second substrate,
the first and second set of ribs comprised of an organic material and having dimensions that allow fitting contact with each other to achieve the aligned interlocking or engagement, each rib of the first set of ribs having a first flat end surface that is opposite the second substrate and is spaced apart from the second substrate, each rib of the second set of ribs having a second flat end surface that is opposite the first substrate and is spaced apart from the first substrate, a side surface of each rib of the first set of ribs extending from the first flat end surface being in continuous contact with a side surface of a respective one of the second set of ribs extending from the second flat end surface,
wherein an outer surface of the first and second set of ribs is surrounded by a metal material, and
wherein one end of the first and second set of ribs is electrically connected with the first pad electrode, and the other end of the first and second set of ribs is electrically connected with the second pad electrode.

10. The apparatus of claim 9, wherein the ribs are located within a non-display area of each substrate, and within a dead-zone in a display area of each substrate.

11. The apparatus of claim 10, wherein the first and second pad electrodes on the first and second substrates, respectively, are electrically connected to each other via a material containing conductive balls or via direct metal layer contact without use of conductive balls.

12. The apparatus of claim 11, wherein the specific configuration of the ribs include a width within a range of tens to hundreds of micrometers and a height within a range of tens to hundreds of micrometers.

13. The apparatus of claim 12, wherein the ribs are made of negative photoresist material or positive photoresist material that is subject to a photolithographic process.

14. The apparatus of claim 12, wherein the ribs are made of an organic material that allows for inkjet printing, reverse offset printing, thermal imaging, gravure offsetting, imprint processing or roll-to-roll processing.

15. The apparatus of claim 12, wherein the display panel is configured to be foldable.

* * * * *